(12) United States Patent
Mishra et al.

(10) Patent No.: US 8,855,176 B1
(45) Date of Patent: *Oct. 7, 2014

(54) SERIALIZER/DESERIALIZER APPARATUS WITH LOOPBACK CONFIGURATION AND METHODS THEREOF

(71) Applicant: INPHI Corporation, Santa Clara, CA (US)

(72) Inventors: Parmanand Mishra, Thousand Oaks, CA (US); Michael S. Harwood, Rushden (GB)

(73) Assignee: Inphi Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/256,792

(22) Filed: Apr. 18, 2014

Related U.S. Application Data

(63) Continuation of application No. 13/802,620, filed on Mar. 13, 2013, now Pat. No. 8,731,031.

(60) Provisional application No. 61/641,400, filed on May 2, 2012.

(51) Int. Cl.
*H04B 1/38* (2006.01)
*H04L 25/06* (2006.01)

(52) U.S. Cl.
CPC .................................. *H04L 25/063* (2013.01)
USPC ........................................ 375/221; 375/219

(58) Field of Classification Search
CPC .... H04L 1/205; H04L 1/242; H04L 25/03019
USPC .................................................. 375/221, 219
See application file for complete search history.

(56) References Cited

U.S. PATENT DOCUMENTS

| | | | | |
|---|---|---|---|---|
| 8,395,446 | B1* | 3/2013 | Tran .............................. | 330/254 |
| 2007/0121711 | A1* | 5/2007 | Offord et al. ................. | 375/219 |
| 2009/0304054 | A1* | 12/2009 | Tonietto et al. .............. | 375/221 |
| 2012/0189086 | A1* | 7/2012 | Cai et al. ...................... | 375/371 |

* cited by examiner

*Primary Examiner* — Juan A Torres
(74) *Attorney, Agent, or Firm* — Richard T. Ogawa; Ogawa P.C.

(57) ABSTRACT

The present invention is directed to integrated circuits. In a specific embodiment, high frequency signals from an equalizer are directly connected to a first pair of inputs of a sense amplifier. The sense amplifier also has a second pair of inputs, which can be selectively coupled to output signals from a DAC or high frequency loopback signals. There are other embodiments as well.

20 Claims, 6 Drawing Sheets

SERIALIZER/DESERIALIZER APPARATUS WITH LOOPBACK CONFIGURATION AND METHODS THEREOF

CROSS-REFERENCES TO RELATED APPLICATIONS

This patent application claims priority to and is a continuation of U.S. Nonprovisional patent application Ser. No. 13/802,620, filed Mar. 13, 2013, which claims priority to U.S. Provisional Patent Application No. 61/641,400, filed May 2, 2012, entitled "Loop-back in SerDes", all of which are incorporated by reference herein for all purposes.

STATEMENT AS TO RIGHTS TO INVENTIONS MADE UNDER FEDERALLY SPONSORED RESEARCH AND DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention is directed to integrated circuits.

A Serializer/Deserializer ("SerDes") is a pair of functional blocks commonly used in high speed communications to compensate for limited input/output. These blocks convert data between serial data and parallel interfaces in each direction. The term "SerDes" generically refers to interfaces used in various technologies and applications. Typically, a SerDes device has a loopback function, which useful for error checking and debugging, among other things. There have been conventional techniques and systems for providing loopback functions.

Unfortunately, existing loopback techniques in SerDes have been inadequate. It is therefore desirable to have new and improved systems and techniques for loopback in Ser-Des, as described below.

BRIEF SUMMARY OF THE INVENTION

The present invention is directed to integrated circuits. In a specific embodiment, high frequency signals from an equalizer are directly connected to a first pair of inputs of a sense amplifier. The sense amplifier also has a second pair of inputs, which can be selectively coupled to output signals from a DAC or high frequency loopback signals. There are other embodiments as well.

According to an embodiment, the present invention provides an integrated circuit device. The device includes an equalizer configured to output a first input voltage and a second input voltage. First input voltage and the second voltage can be a differential pair. The first input voltage carries serial data at a frequency of at least 1 GHz. The second input voltage carrying serial data at a frequency of at least 1 GHz. The device also includes a digital to analog converter configured to output a first DAC signal and a second DAC signal. The first DAC signal and the second DAC signals are characterized by a frequency of less than 0.5 GHz. The device additionally includes a loopback driver being configured to output a first loopback signal and a second loopback signal. The first loopback signal and the second loopback signal are characterized by a frequency of at least 1 GHz. The device additionally includes a first switch coupled to the first loopback signal. The first switch comprising a first filter. The device also includes a second switch coupled to the second loopback signal. The second switch includes a second filter. The device additionally includes a sense amplifier having first input coupled to the first input voltage, a second input coupled to the second input voltage, a third input coupled to the first loopback signal through the first switch and the first DAC signal, a fourth input coupled to the second loopback signal through the second switch and the second DAC signal. The integrated circuit device is configured to operate in a data mode and a loopback mode. In data mode, the sense amplifier is configured to receive at least the first input voltage and the first DAC signal, and the first switch is turned off. In loopback mode, the sense amplifier is configured to receive at least the loopback signal, and the first switch is turn on.

According to another embodiment, the present invention provides an integrated circuit that includes an equalizer configured to output a first input voltage carrying serial data at a frequency of at least 1 GHz. The device also includes a digital to analog converter configured to output a first DAC signal characterized by a frequency of less than 0.5 GHz. The device additionally includes a loopback driver configured to output a first loopback signal. The first loopback signal is characterized by a frequency of at least 1 GHz. The device also includes a first switch coupled to the first loopback signal. The first switch includes a first filter. The device additionally includes a sense amplifier having first input coupled to the first input voltage and a second input coupled to the first loopback signal through the first switch and the first DAC signal. The integrated circuit device is configured to operate in a data mode and a loopback mode. In data mode, the sense amplifier is configured to receive at least the first input voltage and the first DAC signal, the first switch being turned off. In loopback mode, the sense amplifier is configured to receive at least the loopback signal, and the first switch is turn on.

According to yet another embodiment, the present invention provides a SerDes apparatus. The apparatus includes a transmitting circuit and a receiving circuit. The receiving circuit including an equalizer configured to output a first input voltage and a second input voltage. The first input voltage carries serial data at a frequency of at least 1 GHz. The second input voltage carries serial data at a frequency of at least 1 GHz. The receiving circuit also includes a digital to analog converter configured to output a first DAC signal and a second DAC signal. The first DAC signal and the second DAC signals are characterized by a frequency of less than 0.5 GHz. The receiving circuit additionally includes a loopback driver configured receiving a first loopback signal from the transmitting circuit and to output the first loopback signal and a second loopback signal. The receiving circuit further includes a first switch coupled to the first loopback signal. The first switch includes a low frequency filtering capacitor. The receiving circuit also includes a second switch coupled to the second loopback signal, which also has low frequency filtering capacitor. The receiving circuit additionally includes a sense amplifier having first input coupled to the first input voltage, a second input coupled to the second input voltage, a third input coupled to the first loopback signal through the first switch and the first DAC signal, a fourth input coupled to the second loopback signal through the second switch and the second DAC signal. The SerDes apparatus is configured to operate in a data mode and a loopback mode. In data mode, the sense amplifier is configured to receive at least the first input voltage and the first DAC signal, and the first switch is turned off. In loopback mode, the sense amplifier is configured to receive at least the loopback signal, and the first switch is turn on.

It is to be appreciated that embodiments of the present invention provides numerous advantages. The embodiments of the present invention provides techniques and methods that use an offset correction circuit that is already in existence to couple a loopback signal back to a receiver, thereby preventing additional loss of bandwidth due to the loopback signal path. In addition, embodiments according to the present invention can be implemented with existing devices and systems. There are other benefits as well.

DETAILED DESCRIPTION OF THE INVENTION

Figure 1:
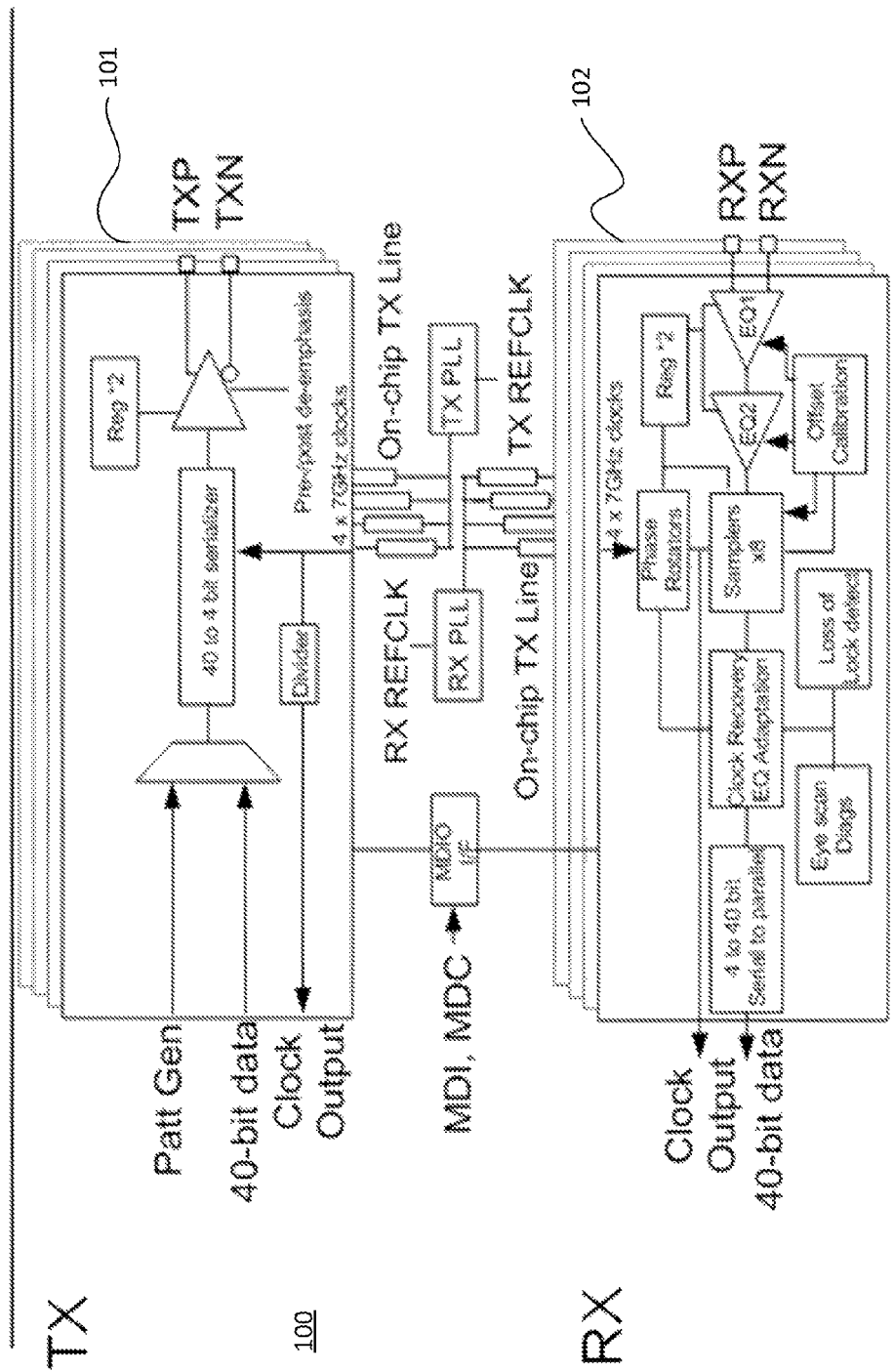
FIG. 1 is a simplified diagram illustrating a SerDes apparatus according to an embodiment of the invention.

The present invention is directed to integrated circuits. In a specific embodiment, high frequency signals from an equalizer are directly connected to a first pair of inputs of a sense amplifier. The sense amplifier also has a second pair of inputs, which can be selectively coupled to output signals from a DAC or high frequency loopback signals. There are other embodiments as well.

As explained above, SerDes are used for many applications. Most SerDes transceivers require an internal loopback feature whereby data is fed from the transmitter to the receiver without physically leaving the transceiver itself. There are reasons for this requirement. First, loopback feature is needed for testing. For example, production test is performed "at-speed" (e.g., high speed at 28 Gb/s), which is not feasible with pattern based tests. In addition, loopback feature is often needed for in-system diagnostics for customers.

For good performance, the loopback process is to be performed as close to the output line-driver as possible (e.g., as proscribed in the IEEE 802.3 standard requirement and also to maximize test coverage).

Adding loopback to a receiver normally involves using multiplexers to isolate the receiver input from the outside world and to couple the transmitter output directly to the receiver. However, the multiplexers can add capacitance and/or resistance to the high-bandwidth nodes of the receiver. This degrades link performance by reducing the receiver bandwidth.

In addition, high bandwidth receiver circuits often require small geometry CMOS processes and small device sizes. These circuits tend to have high inherent offsets that need correcting. Therefore, it is to be appreciated the embodiments of the present invention provides techniques and methods that use an offset correction circuit that is already in existence to couple a loopback signal back to a receiver, thereby preventing additional loss of bandwidth due to the loopback signal path.

In various embodiments, the offset correction inputs can receive a low-pass filtered, fixed signal from a DAC which directly corrects for receiver offsets when in normal operating mode, or a loopback signal from the transmitter when in loopback mode. For example, low-pass filtering capacitors can be used in a high-pass mode to AC couple the loop-back signal onto the receiver circuitry as required. When in loopback mode the offset correction is inoperative, but the loopback mode does not represent a highly stressed condition for the data receiver. The detailed description is provided below.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of or "act of in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

FIG. 1 is a simplified diagram illustrating a SerDes apparatus according to an embodiment of the invention. This diagram is merely an example, which should not unduly limit the scope of the claims. One of ordinary skill in the art would recognize many variations, alternatives, and modifications. As shown in FIG. 1, the SerDes 100 includes an RX (receiving) functional block 102 and a TX (transmitting) function block 101. For example, the TX function block 101 drives the loopback signals that is processed by the RX functional block 102.

Figure 2:
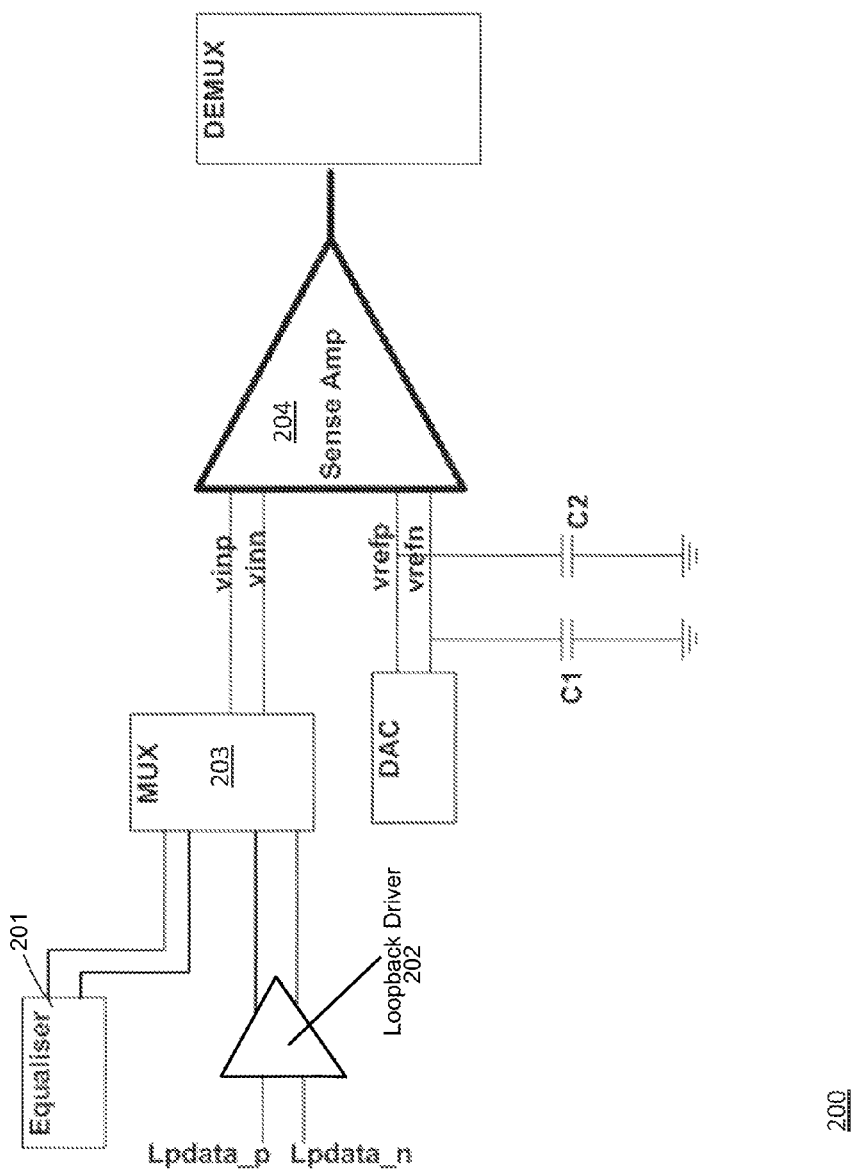
FIG. 2 is a simplified diagram illustrating a conventional SerDes loopback structure.

FIG. 2 is a simplified diagram illustrating a conventional SerDes loopback structure. As shown in FIG. 2, the circuit comprises a multiplexer 203 that is used to select between output from the equalizer 201 and output from the loopback driver 202. The output from the equalizer 201 is data transferred during normal operation of the SerDes. The output from the loopback driver 202 is loopback data from the TX block (not shown) of the SerDes that is typically used for debugging or diagnostics. Signals from both the equalizer 201 and the loopback driver are high frequency signals (e.g., 28 GHz). The sense amplifier 204 is configured to selectively receive signal from either the equalizer 201 or the loopback driver 202. For example, in main data mode, the output from the equalizer 201 is selected; in loopback mode, the output from the loopback driver 202 is selected. The multiplexer 203 is used to select output from the equalizer 201 or the loopback driver 202.

As explained above, the multiplexer 203 is used to isolate the receiver input from the outside world (i.e., data from the equalizer 201) and to couple the transmitter output directly to the receiver (i.e., data from the loopback driver 202). The multiplexer 203, when configured as a part of the SerDes, typically add capacitance and/or resistance to high-bandwidth nodes of the receiver of the SerDes, thereby degrading link performance and reducing the receiver bandwidth. In addition, the multiplexer 203 often takes up too much valuable circuit area. High bandwidth receiver circuits often require small geometry CMOS processes and small device sizes. Multiplexers, on the other hand, tend to have high inherent offsets that need correcting. Therefore, it is to be appreciated that the multiplexer component is removed according to embodiments of the present invention.

Figure 3:
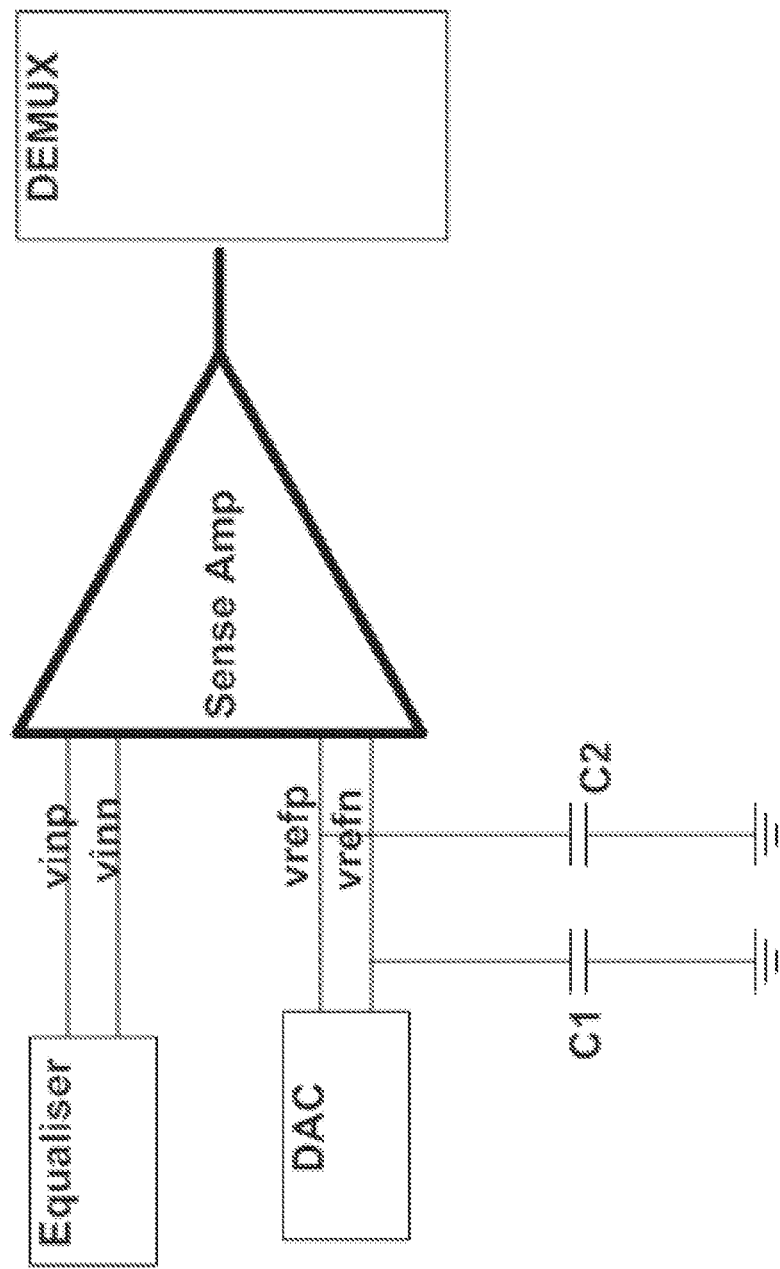
FIG. 3 is a simplified diagram illustrating a SerDes structure according to an embodiment of the present invention.

FIG. 3 is a simplified diagram illustrating a SerDes structure according to an embodiment of the present invention. This diagram is merely an example, which should not unduly limit the scope of the claims. One of ordinary skill in the art would recognize many variations, alternatives, and modifications. As shown in FIG. 3, the loopback section and the multiplexer are removed.

Figure 4:
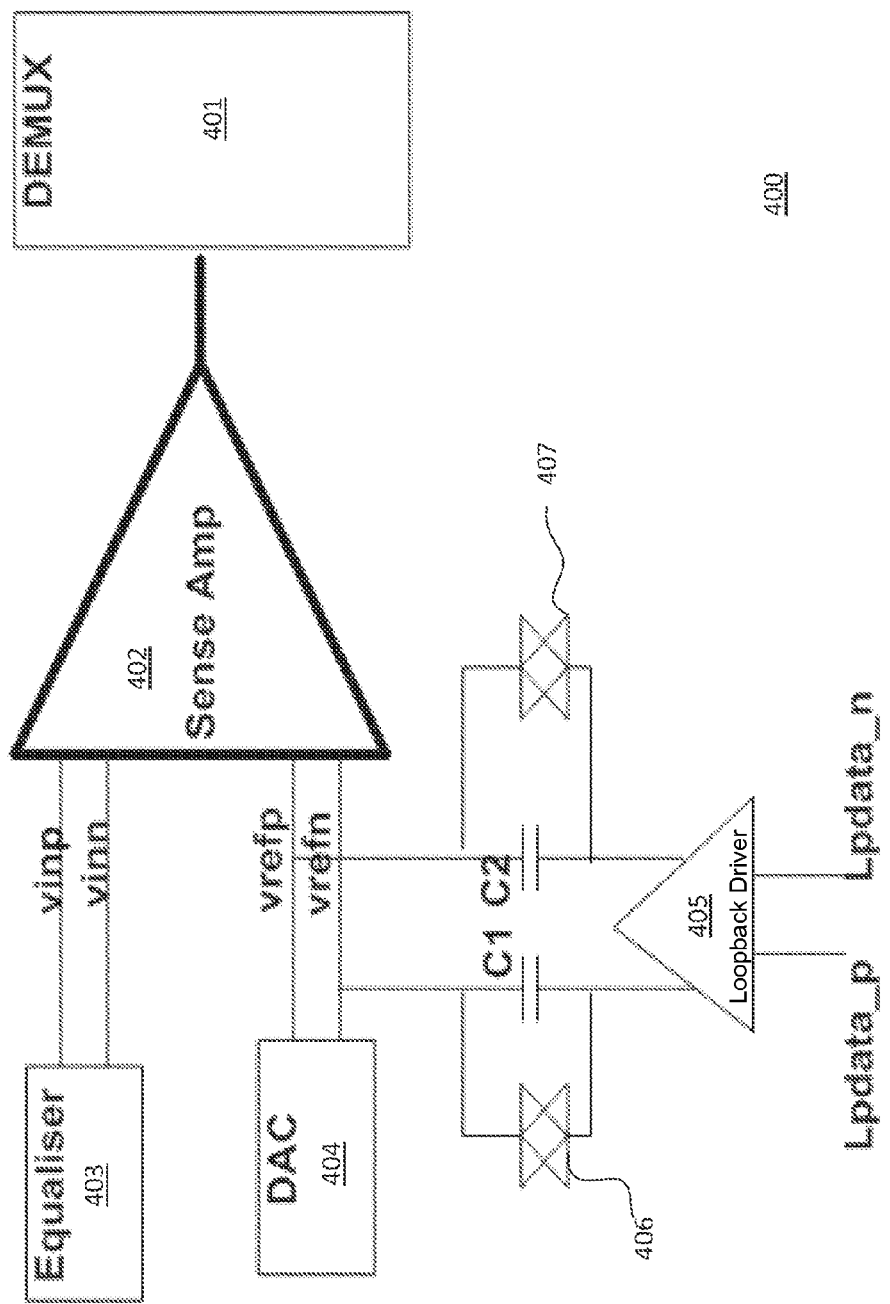
FIG. 4 is a simplified diagram illustrating a SerDes loopback structure according to an embodiment of the present invention.

FIG. 4 is a simplified diagram illustrating a SerDes loopback structure according to an embodiment of the present invention. This diagram is merely an example, which should not unduly limit the scope of the claims. One of ordinary skill in the art would recognize many variations, alternatives, and modifications. As an example, various components of the circuit 400 are a part of the RX block in FIG. 1. As shown in FIG. 4, the output of equalizer 403 is directly provided to the sense amplifier 402. For example, the output of the equalizer 403 includes receiver input from the outside world. According to various embodiments, the outputs of the equalizer 403 Vinp and Vinn are received as a differential pair. The loopback driver 205 is configured to drive loopback signals Lpdata_p and Lpdata_n. For example, the loopbacks signals Lpdata_p and Lpdata_n constitute a differential pair. In various embodiments, loopback drivers are implemented with CMOS drivers, but it is to be understood that other drivers are possible as well. The output signals from both the equalizer 403 and the loopback driver 405 are high frequency data signals. For example, the output signals can be 28 GHz.

The digital-to-analog converter (DAC) 404 is configured to provide convert digital signals to analog signals, and output the analog signals. In various embodiments, the DAC 404 provides reference signal pair Vrefp and Vrefn. The outputs of the DAC 404, Vrefp and Vrefn, are provided to the sense amplifier 402. For example, Vrefp and Vrefn are used for offset correction. The offset correction inputs of the sense amplifier 402 can receive a low-pass filtered, fixed signal from the DAC 404 which directly corrects for receiver offsets when in normal operating mode, or a loopback signal from the transmitter when in loopback mode. The outputs of the DAC 404 are at a much lower frequency than the outputs of the equalizer 403 and loopback driver 405.

The DAC 404 is coupled to the loopback driver 405 through switches and capacitors. More specifically, the Vrefp output is coupled to the loopback driver 405 through the capacitor C2 and switch 407; the Vrefn output is coupled to the loopback driver 405 through the capacitor C1 and switch 406. The capacitor and switch pairs are configured to drive the loopback inputs. More specifically, the capacitors C1 and C2 function as low-pass filtering. The capacitances of C1 and C2 are related to the filter functions. For example, capacitors C1 and C2 are used to filter the dynamic (switching) change in the DAC 404 output voltage. In various embodiments, capacitors C1 and C2 have a capacitance of about 1 pF to about 10 pF. For example, the capacitors C1 and C2 can be used in a high-pass mode to AC couple a loopback signal onto the receiver circuitry as required. The switches 406 and 407 are provided to ensure that loopback signals work up to DC. Additionally, the switches 406 and 407 determine whether loopback signals pass through, depending on whether in common data mode or loopback mode. In various embodiments, the switches 406 and 407 are implemented with transmission gates, but other components may be used as well.

Figure 5:
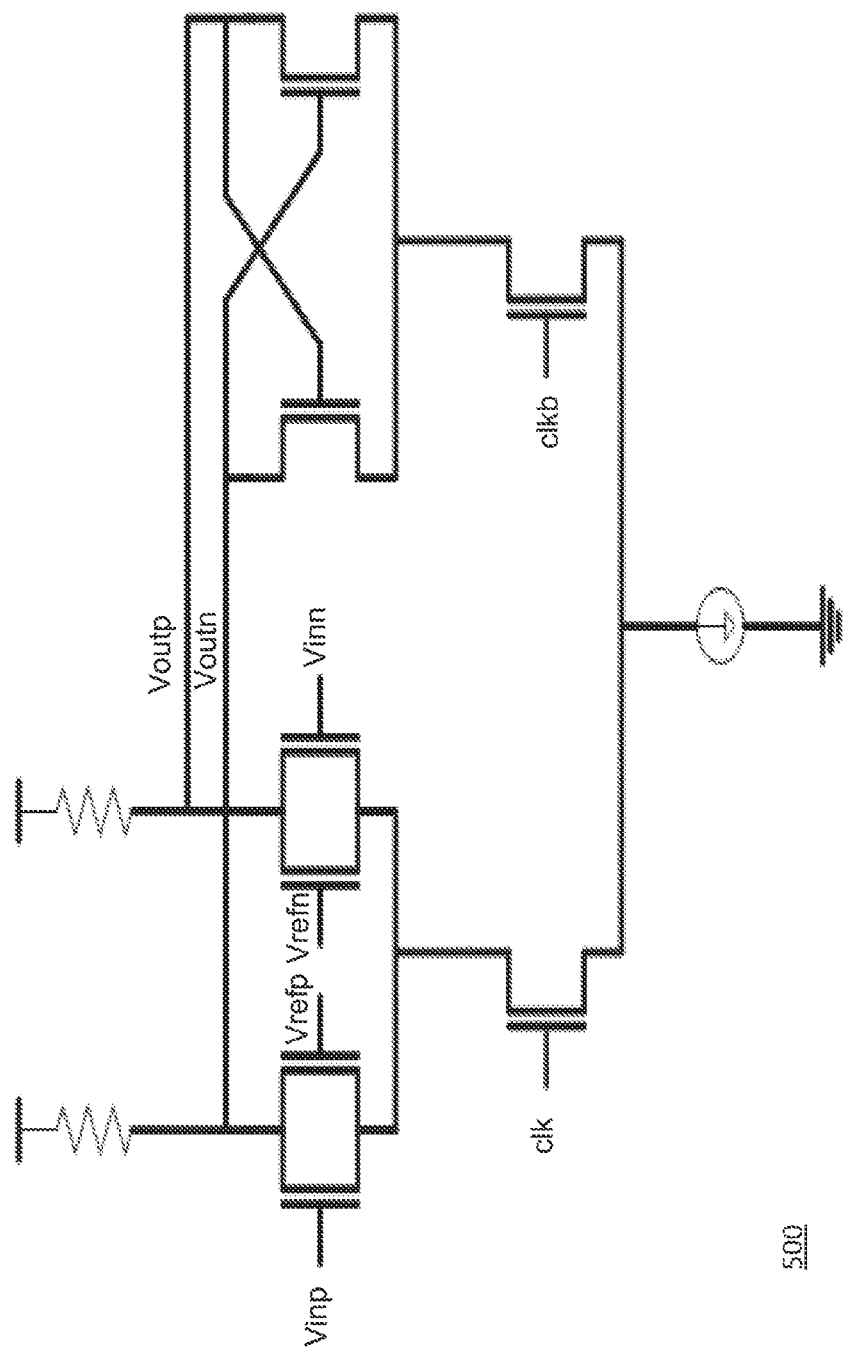
FIG. 5 is a simplified diagram illustrating a sense amplifier according to an embodiment of the present invention.

The sense amplifier 402 is configured to receive signals from the equalizer 403 at a common data mode, and to receive signals from the loopback driver 405 at a loopback mode. The output of the sense amplifier 402 is provided to the de-multiplexer 401. The operation and an exemplary sense amplifier is illustrated in FIG. 5 and described below. In various embodiments, the de-multiplexer 401 is configured to convert serial data to parallel data.

The circuit 400 in FIG. 4 operates in common data mode and loopback mode. At common data mode, the sense amplifier 402 is configured to receive and process signals from the equalizer 403 and the DAC 404. The capacitors C1 and C2 configured to provide filtering. The switches 406 and 407 are off, and loopback signals from the loopback drier 405 is not provided to the sense amplifier 402.

At loopback mode, the sense amplifier 402 is configured to receive and process signals from the loopback driver 405. The DAC 404 is on. The capacitors C1 and C2 are used to drive the loopback inputs. The switches 406 and 407 used to ensure that the loopback works up to DC. According to an embodiment, the equalizer 403 sets the common mode inputs to the Vinp/Vinn pins during loopback mode. In various embodiments, when in loopback mode, offset correction is inoperative.

FIG. 5 is a simplified diagram illustrating a sense amplifier according to an embodiment of the present invention. This diagram is merely an example, which should not unduly limit the scope of the claims. One of ordinary skill in the art would recognize many variations, alternatives, and modifications. As shown in FIG. 5, a sense amplifier 500 receives inputs Vinp and Vinn, which can be from the loopback driver in loopback mode or from the equalizer in common data mode. The Vrefp and Vrefn are reference offsets, which can be received from the DAC. The sense amplifier receives clock signals that drive the input signals.

Figure 6:
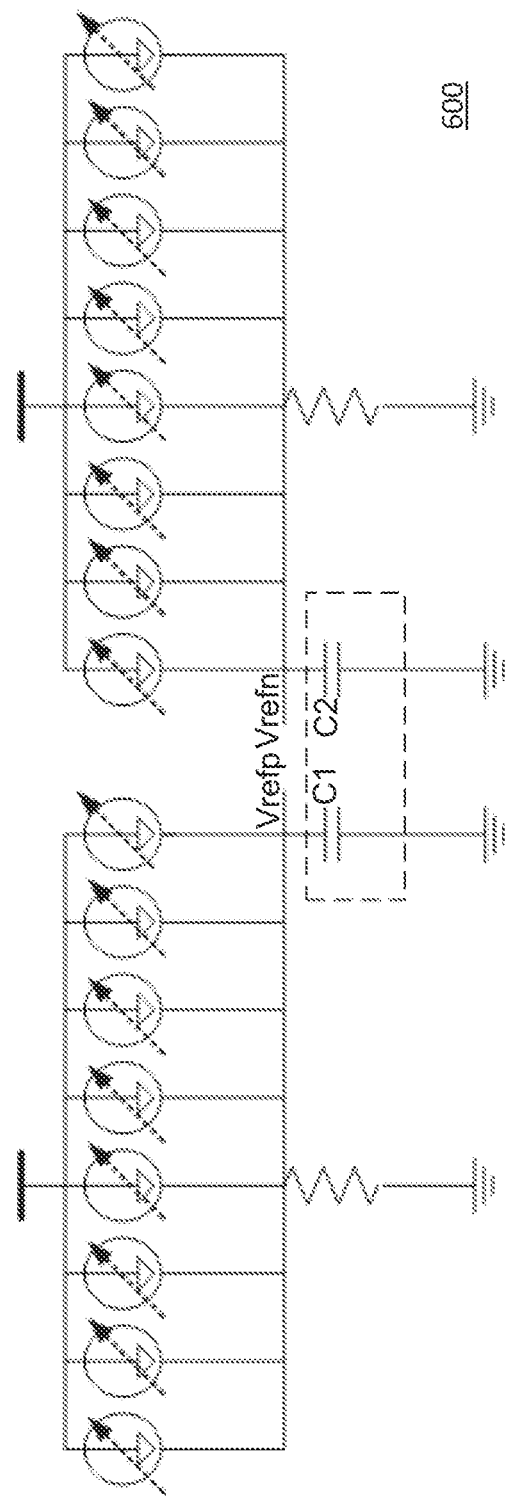
FIG. 6 is a simplified diagram of a DAC according to an embodiment of the present invention.

FIG. 6 is a simplified diagram of a DAC according to an embodiment of the present invention. This diagram is merely an example, which should not unduly limit the scope of the claims. One of ordinary skill in the art would recognize many variations, alternatives, and modifications. As shown in FIG. 6, the DAC 600 is coupled to capacitors C1 and C2. For example, the capacitors C1 and C2 are low-pass filtering capacitors.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method for operating an integrated circuit device, the method comprising:
   outputting a first input voltage and a second input voltage using an equalizer, the first input voltage carrying serial data at a frequency of at least 1 GHz, the second input voltage carrying serial data at a frequency of at least 1 GHz;
   outputting a first DAC signal and a second DAC signal using a digital to analog converter, the first DAC signal and the second DAC signals being characterized by a frequency of less than 0.5 GHz;
   outputting a first loopback signal and a second loopback signal using a loopback driver, the first loopback signal and the second loopback signal being characterized by a frequency of at least 1 GHz, the first loopback signal coupled to a first switch, the first switch comprising a first filter, the second loopback signal coupled to a second switch, the second switch comprising a second filter; and
   receiving a signal at a sense amplifier, the sense amplifier having a first input coupled to the first input voltage, a second input coupled to the second input voltage, a third input coupled to the first loopback signal through the first switch and the first DAC signal, a fourth input coupled to the second loopback signal through the second switch and the second DAC signal;
   whereupon the equalizer, the digital to analog converter, the loopback driver, and the sense amplifier are configured on the integrated circuit device.

2. The method of claim 1 wherein the first input voltage and the second voltage are a differential pair.

3. The method of claim 1 further comprising a de-multiplexer coupled to an output of the sense amplifier.

4. The method of claim 1 wherein the first reference signal is characterized by a frequency of at least 28 GHz.

5. The method of claim 1 wherein:
   the integrated circuit device is configured to operate in a data mode and a loopback mode;
   in data mode, the sense amplifier is configured to receive at least the first input voltage and the first DAC signal, the first switch being turned off;
   in loopback mode, the sense amplifier is configured to receive at least the loopback signal, the first switch being turn on.

6. The method of claim 1 wherein the first switch comprises a transmission gate.

7. The method of claim 1 wherein the first filter comprises a first capacitor, the first capacitor is characterized by a capacitance of about 1 pF to 10 pF.

8. The method of claim 1 wherein the first filter is a low-pass filtering capacitor.

9. The method of claim 1 wherein the first switch comprises a transmission gate configured in parallel to the first filter.

10. The method of claim 1 wherein the signal received by the sense amplifier comprising a first clock signal and a second clock signal.

11. The method of claim 1 the sense amplifier is configured to compare the first input voltage to the first loopback signal.

12. The method of claim 1 wherein the DAC comprises two 8-bit converters.

13. A method for transferring communication information using an integrated circuit device, the method comprising:
   outputting a first input voltage carrying serial data at a frequency of at least 1 GHz using an equalizer;
   outputting a first DAC signal characterized by a frequency of less than 0.5 GHz using a digital to analog converter;
   outputting using a loopback driver, a first loopback signal, the first loopback signal being characterized by a frequency of at least 1 GHz, the first loopback signal being coupled to a first switch coupled to the first loopback signal, the first switch comprising a first filter; and
   receiving a signal at a sense amplifier, the sense amplifier having a first input coupled to the first input voltage and a second input coupled to the first loopback signal through the first switch and the first DAC signal;
   wherein the equalizer, converter, loopback driver, and sense amplifier are configured on the integrated circuit device; and
   wherein:
      the integrated circuit device is configured to operate in a data mode and a loopback mode;
      in data mode, the sense amplifier is configured to receive at least the first input voltage and the first DAC signal, the first switch being turned off.

14. The method of claim 13 wherein the first filter comprises a low-pass filtering capacitor.

15. The method of claim 13 further comprising clock coupled to the sense amplifier.

16. The method of claim 13 further comprising a de-multiplexer.

17. The method of claim 13 wherein the equalizer is directly couple to the sense amplifier.

18. The method of claim 13 further comprising a serial to parallel converter coupled to the sense amplifier.

19. The method of claim 13 further wherein the first loopback signal is received from a transmitter.

20. A method of using a SerDes apparatus, the method comprising:
   providing the SerDes apparatus, the apparatus comprising a transmitting circuit;
   a receiving circuit, the receiving circuit comprising:
   an equalizer configured to output a first input voltage and a second input voltage, the first input voltage carrying serial data at a frequency of at least 1 GHz, the second input voltage carrying serial data at a frequency of at least 1 GHz;
   a digital to analog converter configured to output a first DAC signal and a second DAC signal, the first DAC signal and the second DAC signals being characterized by a frequency of less than 0.5 GHz;
   a loopback driver being configured receiving a first loopback signal from the transmitting circuit and to output the first loopback signal and a second loopback signal;
   a first switch coupled to the first loopback signal, the first switch comprising a first filter;
   a second switch coupled to the second loopback signal, the second switch comprising a second filter; and
   a sense amplifier having first input coupled to the first input voltage, a second input coupled to the second input voltage, a third input coupled to the first loopback signal through the first switch and the first DAC signal, a fourth input coupled to the second loopback signal through the second switch and the second DAC signal; and
   using the SerDes apparatus.

* * * * *